United States Patent [19]

Yokokawa

[11] Patent Number: 5,540,059

[45] Date of Patent: Jul. 30, 1996

[54] METHOD AND APPARATUS FOR SUPPLYING GASEOUS RAW MATERIAL

[75] Inventor: Kiyoshi Yokokawa, Annaka, Japan

[73] Assignee: Shin-Etsu Quartz Products Co., Ltd., Tokyo, Japan

[21] Appl. No.: 378,380

[22] Filed: Jan. 25, 1995

[30] Foreign Application Priority Data

Feb. 28, 1994 [JP] Japan .................................. 6-052547

[51] Int. Cl.⁶ ............................................ F17C 3/10
[52] U.S. Cl. .......................... 62/48.2; 62/50.2; 141/4; 141/11; 141/82
[58] Field of Search ............................ 62/50.2, 48.2; 141/4, 11, 82

[56] References Cited

U.S. PATENT DOCUMENTS

| | | | |
|---|---|---|---|
| 2,363,200 | 11/1944 | Pew et al. ................... | 62/50.2 |
| 3,135,099 | 6/1964 | Holm ......................... | 62/50.2 |
| 3,241,328 | 3/1966 | Engel et al. ................ | 62/50.2 |
| 3,302,418 | 2/1967 | Walter ........................ | 62/50.2 |
| 4,175,395 | 11/1979 | Prost et al. ................. | 62/50.2 |
| 5,107,906 | 4/1992 | Swenson et al. ........... | 141/11 |

FOREIGN PATENT DOCUMENTS

| | | |
|---|---|---|
| 61-254242 | 11/1986 | Japan . |
| 1-293130A | 11/1989 | Japan . |
| 2-63543 | 3/1990 | Japan . |
| 4-342434 | 11/1992 | Japan . |
| WO86/01232 | 2/1986 | WIPO . |

*Primary Examiner*—Ronald C. Capossela
*Attorney, Agent, or Firm*—Finnegan, Henderson, Farabow, Garrett & Dunner

[57] ABSTRACT

Method and apparatus for supplying a gaseous raw material to plural users. A liquid raw material is evaporated by a single evaporation means and supplied to a gaseous raw material takeout portion provided with a plurality of takeout ports. The gas pressure is varied according to amounts of the gaseous raw material taken out of the takeout ports. The pressure variations are regulated by a main pressure-adjusting means mounted downstream of the gaseous raw material takeout portion. Extra gaseous raw material is sent to a gaseous raw material-condensing means, where the material is liquified. Then, the liquified material is fed back to the evaporation means. Thus, a closed circulatory loop circuit is formed. The gas pressure in the gaseous raw material takeout portion is regulated. The gaseous raw material is distributed to plural users at any desired time at their respective flow rates such that supply of the raw material to each individual user is carried out independent of supply to other users.

11 Claims, 1 Drawing Sheet

METHOD AND APPARATUS FOR SUPPLYING GASEOUS RAW MATERIAL

BACKGROUND OF THE INVENTION

1. Field of the Invention

The present invention relates to a method and apparatus for supplying gaseous raw materials which are used to manufacture fused silica glass preforms for optical fibers and also to manufacture semiconductor devices.

2. Description of the Related Art

Heretofore, various gaseous raw materials have been used in manufacture of fused silica glass preforms for optical fibers and also in manufacture of semiconductor devices. It is essential to accurately control the flow rates of supplied gases. Generally, in order to place emphasis on the accuracy of the flow rates of the supplied gases, one installation is equipped with one set of raw material supply equipment to completely prevent the gases against external disturbances from other apparatus. Of course, in some cases, a gaseous raw material is injected into plural evaporators separately. In other cases, a gaseous raw material is automatically introduced from the outside by the use of collecting piping.

Where a gaseous raw material generated by the same evaporator should be used by other users, even if each of them has an accurate flowmeter such as a mass flow controller, a problem takes place. In particular, when one user blocks off or permits supply of the gas into this user, the flow rates of the gas supplied to the other users are affected. As a result, a noise is introduced in the accurate reaction process. This adversely affects the characteristics of the final products. Accordingly, in a reaction system designed to provide high accuracy, the flow rates of the gaseous raw material supplied to plural users are not controlled independently in a time-domain in stages following the evaporator. That is, because the accuracy has problems, even if every user has a mass flow controller, for example, it is customary to make the operations manual so that every manufacturing batch may be placed under the same conditions. During a reaction, the gaseous raw material is sent to users from the same evaporator normally under the same heater conditions and at the same pressure. Where it is necessary for a user to greatly adjust the flow rate of the gaseous raw material or to block off or permit the supply, it is common practice to adjust the heat source of the evaporator. For instance, the electric power fed to a heater is adjusted or stopped. It is known to supply a gaseous raw material to plural users from a single evaporator. In this case, however, the number of the users is limited to two or three. Moreover, the reaction conditions are maintained substantially constant from the start of the reaction for each user until the reaction is completed. The flow rates of the gas supplied to the users, respectively, are not adjusted or blocked off independently.

In addition to the foregoing problems, as high technology has evolved in recent years, the number and kinds of gas installations have increased. If each unit is provided with a separate gaseous raw material supply device, then the installation cost is increased. Also, it is more difficult to secure installation space. Additionally, it is more difficult to manage the installations. In this way, serious problems have occurred.

In high technologies, especially in optical-fiber manufacturing sections and in semiconductor fabrication sections, used raw-material gases and other gases are corrosive compounds such as chlorine, bromine, and fluorine, poisonous gases typified by chlorine, phosphine, and arsine, or etchant gases such as hydrofluoric acid, hydrochloric acid, or nitric acid. In this way, many gases entail dangers when treated. Therefore, management of these dangerous gases has become comparable to, or even has surpassed, management of accuracy in importance.

In view of these circumstances, we have earnestly investigated means for supplying and distributing hazard gases without deteriorating the accuracy of supply of gaseous raw materials, using apparatus that can be managed easily and can be centralized. As a result, we have found a method of supplying a gaseous raw material in such a way that each individual user can independently take out the gas at a desired flow rate at any desired time, by circulating the gaseous raw material generated from an evaporation means through a closed loop without blocking off the flow of the gas and by forming a plurality of takeout ports in the closed loop. The number of raw-material evaporation means which often induce troubles can be reduced.

SUMMARY OF THE INVENTION

It is an object of the present invention to provide a novel method of supplying a gaseous raw material to a plurality of users independently at any desired time and at any arbitrary flow rate, using a single raw-material evaporation means.

It is another object of the invention to provide a gaseous raw material supply apparatus which is equipped with a single raw-material evaporation means and capable of supplying a gaseous raw material to a plurality of users independently at any desired time and at any desired flow rate.

It is a further object of the invention to provide a compact gaseous raw material supply apparatus capable of supplying a hazard gas safely and accurately.

A gaseous raw material supply apparatus and method according to the present invention uses a single evaporation means for evaporating a gaseous raw material, a gaseous raw material takeout portion provided with a plurality of takeout ports, a main pressure-adjusting means mounted downstream of the gaseous raw material takeout portion, and a gaseous raw material-condensing means. The raw material evaporated by the single evaporation means is supplied to the gaseous raw material takeout portion. The pressure of the gas varied according to the flow rate of the gaseous raw material taken out through each takeout port is regulated by the main pressure-adjusting means. Extra gaseous raw material is transported to the gaseous raw material-condensing means, where the gas is liquified. The resulting liquid is fed back to the evaporation means. Thus, a closed circulatory loop circuit is formed. The pressure of the gas in the gaseous raw material takeout portion is regulated. The gaseous raw material can be supplied to a plurality of users independently at any desired time at any arbitrary flow rate.

A method of supplying a gaseous raw material according to the present invention consists of distributing the gas supplied from a single evaporation means to a plurality of users at arbitrary time and at any arbitrary flow rate accurately. In other words, variations in the flow rates of the gas distributed to the users which are induced by variations in the pressure of the gaseous raw material are suppressed to a minimum. The gaseous raw material takeout portion is provided with a plurality of (e.g., m) takeout ports. Essentially, the present invention assumes that end users $n_1$–$n_{30}$ (n=3 to 30) are arranged in parallel at the front end of each takeout port (e.g., $m_1$). It is to be noted that n may or may not be uniform. In this case, the front ends of the m takeout ports are preferably operated according to substantially the same time schedule. Therefore, a reaction system (n) operated according to a different time schedule is conveniently provided with a different takeout port ($m_2$). If the primary pressure at the gaseous raw material takeout portion is varied by an increase or decrease in the number of the gas users, then it is highly likely that the flow rates of the gaseous raw material supplied to the other users, respectively, vary frequently. In a first feature of the invention, the primary pressure is maintained as constant as possible by the main pressure-adjusting means. In a second feature of the invention, output lines extending from the gaseous raw material takeout ports and lines connected to the end users are provided with means for controlling the pressure of the gaseous raw material and also with means for controlling the flow rate of the gas. For example, a pressure-reducing valve, a pressure-adjusting device, or the like is installed at the front end of each takeout port (m). Gas flow controllers are provided for the users (n), respectively. Alternatively, a concentrated gas flow controller is installed for all the users.

Other objects and features of the invention will become apparent from the description thereof, which follows.

DESCRIPTION OF THE PREFERRED EMBODIMENT

Figure 1:
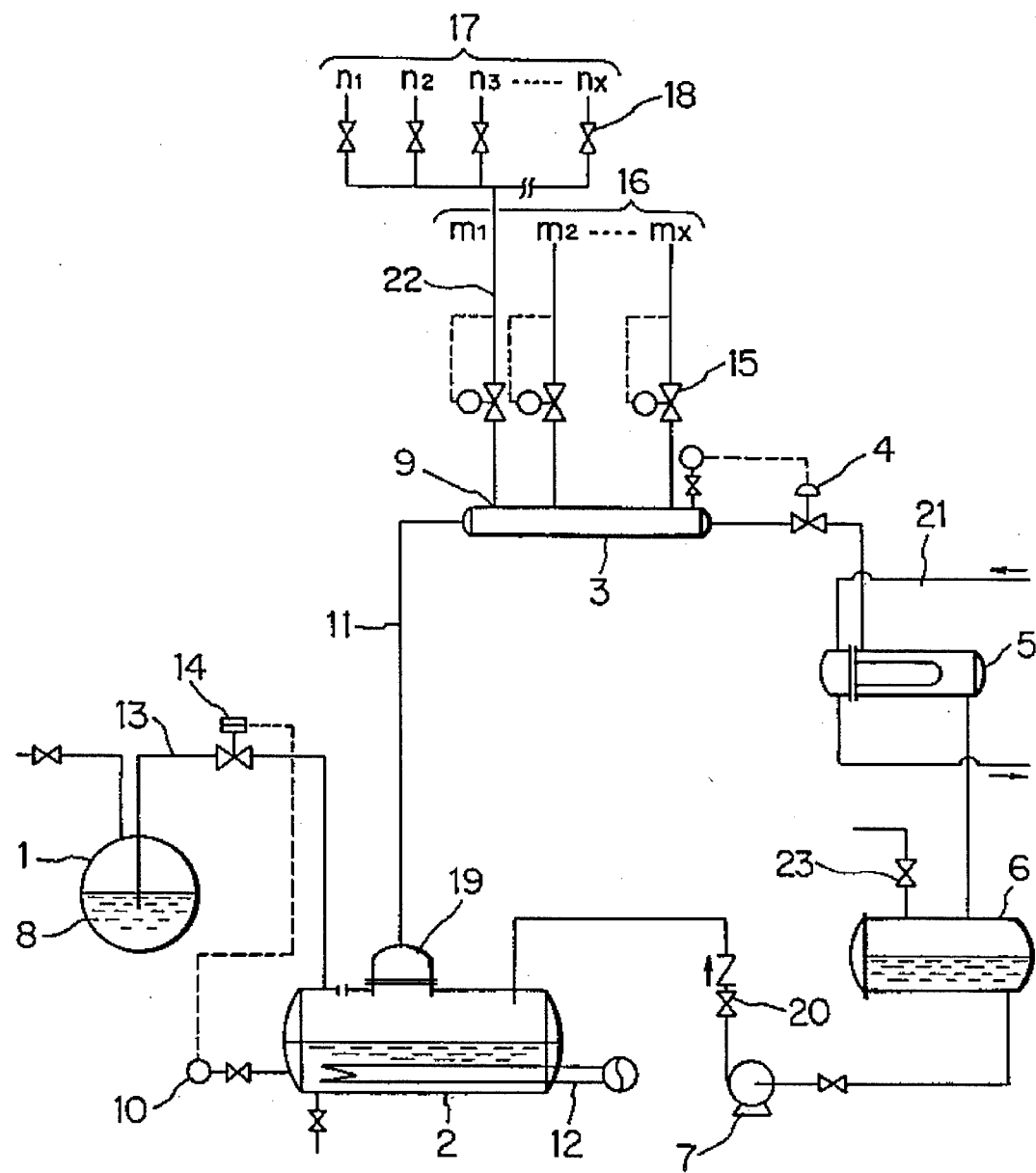
FIG. 1 is a schematic diagram of a gaseous raw material supply apparatus according to the present invention.

Referring to FIG. 1, there is shown a gaseous raw material supply apparatus for implementing a method of supplying a gaseous raw material according to the present invention. This apparatus comprises an evaporation means 2, a gaseous raw material takeout portion 3 provided with plural gas takeout ports 9, a main pressure-adjusting means 4, and a gaseous raw material-condensing means 5. These means 2–5 are arranged in this order to form a closed circulatory loop circuit. A gaseous raw material tank 1 accommodating a liquid raw material 8 is connected with the evaporation means 2. This evaporation means 2 further includes a heat source 12 for evaporating the liquid raw material 8. The size of the raw material tank is so set that the gaseous raw material can be supplied sufficiently even if every user employs the gaseous raw material at the same time, and if every user is run at its maximum capacity. However, the users may alternately and independently exploit the tank over a long term. Therefore, the volume of the tank must be sufficiently large to cope with this situation. In this case, it is better to design the gaseous raw material tank so that further raw material can be injected from the outside. The volume of the tank can be reduced accordingly. Various supply methods which enable this structure are known.

Generally, the heat source 12 makes use of an electrical energy which can be controlled well. However, the heat source is required to have sufficient heating capacity and sufficient heat transfer area to permit the liquid raw material 8 to provide the required vapor pressure. An electric heater is used as the heat source utilizing an electrical energy. Depending on the degree to which the gaseous raw material is used, the heater may be composed of a base heater and some adjusting heaters. Of course, the evaporation means 2 is so designed that the temperature inside the tank is maintained efficiently by an appropriate heat-insulating material.

The main pressure-adjusting means 4 compares the primary pressure inside the evaporation means 2 and in the gaseous raw material gas takeout portion 3 including a gas line 11 with a preset pressure, and adjusts the amount of vapor generated by the evaporator according to the variations in the pressure. The main pressure-adjusting means 4 also acts to release extra vapor toward the gaseous raw material-condensing means 5 so that the primary pressure inside the takeout portion 3 may be controlled within predetermined limits. If release of the extra vapor is continued for a long time, information indicating this situation is fed back to the heater 12 in a manner not illustrated, thus lowering the whole evaporation amount. When none of the users are operating, or when some user is at fault, the main pressure-adjusting means 4 is substantially fully closed according to a computer program. This shuts off the inside of the closed loop circuit or prevents leakage of the gaseous raw material to the outside, leakage of air into the line, and back flow.

The gaseous raw material-condensing means 5 has a cooling heat transfer area sufficient to assure that all the gaseous raw material can be condensed and liquified even if all the users come to a stop. The condensing means 5 is water-cooled or cooled by making heat exchange with other refrigerant line 21. If the liquid raw material going out of the condensing means 5 is received by a receiver tank 6 and returned to the evaporation means 2 directly to evaporate the raw material again, then the amount of evaporation residue is reduced with desirable result, because the liquid raw material has been already refined and evaporated. However, the pressure $P_1$ inside the evaporation means 2 is higher than the pressure $P_2$ inside the receiver tank 6 and so a check valve means is needed. Either a check valve 20 or a liquid transport pump 7 is used for this purpose. Also, natural drop of the liquid raw material due to a height difference can be exploited. Furthermore, it is possible to temporarily return the raw material from the receiver tank 6 into the raw-material storage tank 1 in a manner not illustrated. Preferably, a flowmeter is mounted after the main pressure-adjusting means to estimate the total amount of circulation.

In the closed loop circuit, thermal insulation is provided up to the main pressure-adjusting means 4. Since the material might be heated before returning to the evaporation means 2, the line is preferably thermally insulated. A bumping-preventing mechanism, a mist separator 19 for preventing mist on evaporation, and a buffer mechanism for mitigating pressure variations can be installed in the evaporation means 2. In any case, if a corrosive raw material of high purity is used, the mechanism is preferably simple.

In the above-described closed loop circuit, the gaseous raw material takeout portion 3 is provided with gaseous raw material takeout ports 9 for distributing the gas to users. The takeout ports 9 are located upstream of the main pressure-adjusting means 4. The gas takeout portion 3 may be provided in various ways: (i) the gas takeout ports 9 are formed in parallel with the raw-material gas mounting portion; (ii) a thick pipe branches directly from the evaporator, taking account of pressure loss, and the gas takeout ports 9 are formed in the branching pipe; and (iii) plural branching pipes of a moderate diameter are mounted to the evaporator and act as the raw-material gas takeout ports 9. In any case, the structure close to the takeout ports must be carefully designed so that the users are not affected mutually.

In order to distribute the gaseous raw material to the users through the gaseous raw material takeout ports 9, three to thirty end users (e.g., $n_1$–$n_{30}$) can be mounted parallel to each of the raw-material gas takeout ports which are m in number, for example. Since it is recommended that the front ends of the m gas takeout ports be operated according to substantially the same time schedule. Therefore, the end users ($n_1$–$n_x$) of the reaction system operated according to different time schedules are conveniently provided with m different takeout ports 9, respectively.

Downstream of the gaseous raw material takeout ports 9, gas flow controllers 15 and 18 are installed for each of n users. Alternatively, common concentrated flow controllers 15 and 18 are installed for the users. For example, a user having three end users is equipped with three mass flow controllers. A user having 30 end users is equipped with 30 mass flow controllers. Users having three end users can share one mass flow controller 15 having 30 takeout ports belonging to 10 groups $m_1$, $m_2$, . . . $m_{10}$. Of course, the number of the takeout ports is varied according to the target accuracy of each user.

The gaseous raw material takeout ports 9 may be formed in 3 to 10 locations, for example, for each working time. In practice, the number of the takeout ports is determined, depending on the number of reaction groups (m) and on the amount of the used material. The ratio of the amount of gas v used by a user at each takeout port to the total amount of evaporation V, i.e., v/V, is a measure of stability of supply of the gaseous raw material. As the v/V is reduced, higher stability is obtained. However, if the utilization factor of v/V is low compared with the number of the gaseous raw material takeout ports 9, then the capability to supply the raw material becomes excessive. Also, the installation cost is increased. Accordingly, taking account of the trouble rate, it is desired to form two or more sets of gas takeout ports having moderate capability.

Where accurate supply of a gaseous raw material is required, it is necessary to further suppress variations even if they lie within the tolerable range of the mass flow controllers. At this time, at least one of a pressure-reducing valve for the secondary pressure, a flow controller, and a circuit breaker is conveniently mounted between each gaseous raw material takeout port 9 and an end gas controller to prevent variations in the primary pressure from affecting the mass flow controllers of the other users. In any case, it is desired that any user be started and shut off at a varying speed which can be absorbed by the mass flow controller. This can be sufficiently controlled by a computer. It is also necessary that thermal insulation be provided from the gaseous raw material takeout ports 9 to the end users.

A gaseous raw material supply machine according to the invention is a compact unit where main circuits such as an evaporation means, a main pressure-adjusting means, and a gaseous raw material-condensing means are connected together. The installation space can be reduced to a minimum. Since the gas supply machine takes the form of a unit, it can be easily removed, modified, and exchanged. It is also possible to introduce only users on the secondary side into a reaction chamber; other units having higher danger rates may be installed in a utility chamber or other special chamber or mounted outdoors. In this case, the units can be readily modified and serviced.

As described above, according to the novel gaseous raw material supply method, a gaseous raw material can be accurately supplied to plural users with a single gaseous raw material evaporation means at any desired time and at any desired flow rate without affecting other users. Also, a machine for implementing this method can be rendered compact. Furthermore, a gaseous raw material can be stably supplied to plural users with a single evaporator. Therefore, if the evaporator fails or the gaseous raw material leaks, the trouble can be easily remedied. In addition, only small installation space is necessary.

Application of the novel machine is not limited to the above-described supply of a gaseous raw material. The novel machine is also applicable to the semiconductor-related industry. For example, the machine can be used to manage the temperature inside a closed clean room. The machine can be mounted in a section where strict management of particles is imperative and so it is difficult to install a huge heat source in a closed chamber. The novel machine can be used in an environment where used corrosive gases often leak or where a chamber is contaminated by leakage of gases during remodeling of the machine. The novel machine can also be employed in an industry where safety devices for accurate electronic apparatus are often attacked by corrosive gases.

EXAMPLE 1

Referring again to FIG. 1, there is shown a machine according to the present invention. A liquid raw material 8 is stored in a raw-material tank 1. The raw material 8 is pressurized by a nitrogen-pressurizing tube (not shown) and passed through a conduit 13. Then, the raw material is transported to an evaporator 2 while the flow rate is being controlled by a valve 14. This valve 14 is automatically opened and closed in response to a signal from a level detector 10 that detects the liquid level in the evaporator 2. The operation of the valve 14 is so controlled that the liquid level in the evaporator 2 is kept within a certain range.

The evaporator 2 has a liquid level controller and limiters that determine the upper and lower limits of the liquid level. The liquid level controller is operated within a narrow range to control the liquid level. The valve 14 is automatically operated according to a set value. A heater (not shown) for warming the raw material can be installed between the raw-material storage tank 1 and the evaporator 2 to keep warm the conduit 13. A pressure gauge and an explosion-proof safety valve are mounted on the evaporator 2. The evaporator 2 is provided with liquid vent holes. The whole evaporator 2 is kept warmed. The liquid raw material 8 is heated by the heater 12 in the evaporator 2. To enhance the thermal efficiency of the raw material, a gas feed pipe, takeout-ports 9, and gas feed pipes extending to the users are coated with a heat-insulating material.

The heated liquid raw material 8 evaporates inside the evaporator 2 and is sent to a gas feed pipe 11. The heater 12 comprises a base controller and a control heater which are automatically controlled, depending on the amount of the material used by the user and also on the amount of the material supplied. The evaporated raw material is passed to a gaseous raw material takeout portion 3 via a splash-preventing demister 19. The gaseous raw material takeout portion 3 is provided with several gaseous raw material takeout ports 9. Each takeout port 9 is equipped with a shutoff valve and a pressure-reducing valve 15. At the beginning of operation, all the valves are closed.

A main pressure adjuster 4 is kept closed until the pressure indicated by the raw-material gas pressure gauge mounted on the evaporator 2 reaches a target pressure. The temperature is elevated by the heater 12 of the evaporator 2, and the pressure of the gaseous raw material is started to be increased. When the target pressure is exceeded, the inert gas within the system which activates the main pressure adjuster 4 is cut, together with the foreruns. When the amount of the used gas reaches 80% of the total amount of gas, the value indicated by an electric galvanometer is switched to an automatically set value. The primary pressure is adjusted to the set value.

All the gaseous raw material flowing out of the main pressure adjuster 4 is sent to the gaseous raw material condenser 5 through the gas feed pipe. The condenser 5 cools and liquifies the gaseous raw material by a water-cooling line 21, thus forming a circulated liquid raw material. The liquid raw material flows through the galvanometer and is stored in a receiver tank 6. Since the liquid raw material stored in the tank 6 has high purity, a circuit for preferentially returning the raw material to the evaporator 2 is created, so that the raw material is circulated. A heater is mounted between a liquid transport pump 7 and the evaporator 2 to prevent the temperature of the liquid raw material inside the evaporator from varying greatly. After the raw material has been heated close to the temperature of the liquid raw material inside the evaporator 2, the material is returned. Because the pressure on the side of the evaporator 2 is high, a check valve 20 is installed to prevent back flow. In the initial stage, the inert gas is released from a valve 23. To avoid impurities, the foreruns are sent to an external liquid reservoir at a position located upstream of the pump.

When the circulated liquid raw material reaches about 1.5 times the total amount used by all the users, the cutoff valve 15 in the gaseous raw material takeout port 9 is opened to start supply of the gas to user $m_1$ of the users 16. The user $m_1$ distributes the gas to ten end users $n_1-n_{10}$ (17). Each end user is equipped with a mass flow controller 18. All the end users of the user $m_1$ simultaneously start and stop a reaction, and send the gaseous raw material to ten reaction burners, respectively, via their respective mass flow controllers 18. When the gaseous raw material is started to be passed into the end users of the user $m_1$, a difference is created between the primary pressure and the preset pressure. Therefore, the flow rate of the circulated gas is adjusted by the main pressure adjuster 4 in such a way that the value indicated by a primary pressure gauge is maintained constant. In this case, the operation of the main pressure adjuster is controlled so that it takes about 10 seconds (hereinafter referred to as the preparatory time) to open or close the adjuster. Thus, impacting pressure is not transmitted. The preparatory time and the degree to which the impacting pressure is mitigated are determined according to the ratio of the circulated amount to the supplied amount.

User $m_2$ is operated similarly and simultaneously with the user $m_1$ but independent of the user $m_1$. At this time, four burners are operated. The mass flow controllers of the user $m_1$ are hardly affected. Similar tests are performed on user $m_3$ in which 20 burners are arranged parallel and made to react successively. In reactions persisting for 30 seconds, pressure variations are by no means transmitted to the other users.

If the users $m_1$, $m_2$, and $m_3$ are successively stopped, the amount ($v_1$) of the gaseous raw material supplied to each user drops rapidly and so the circulated amount $v_2$ increases greatly. As a result, the opening of the main pressure adjuster will increase far beyond 50%. Accordingly, the input to the first base heater is lowered under computer control so that the ratio ($v_2/V$) of the circulated amount ($v_2$) to the total amount of evaporation ($V=v_1+v_2$) decreases below 50%. This ratio is then maintained substantially constant.

Charts were drawn according to the output from a recorder in response to the outputs from the indicators of gas flow controllers, respectively. With respect to the users $m_1$, $m_2$, and $m_3$, no variations were observed on starting and stopping. In practice, reactions occurring when variations were taking place were examined by an outer attachment method which is normally used for optical fibers. Movement of the burners and irregularities on deposition of $SiO_2$ on the target were checked. No problems were found. Also, destruction of low-density soot which would have been normally caused by problems did not take place. Furthermore, during vapor-phase axial deposition (VAD), the ratio $Ge/SiO_2$ did not vary nor assumed any irregular value.

What is claimed is:

1. A method for distributing a gaseous raw material to a plurality of user locations comprising:

supplying liquid raw material to an evaporation means;

evaporating the liquid raw material in the evaporation means to form a gaseous raw material;

flowing the gaseous raw material to takeout means having a plurality of gaseous raw material takeout ports;

maintaining the pressure of the gaseous raw material in the takeout means within predetermined limits with a pressure adjusting means;

controlling the supply of gaseous raw material from each takeout port of said takeout means to at least one user location that is located outside of said circuit at a time and at a flow rate independent of each other takeout port;

withdrawing excess gaseous raw material from the takeout means;

condensing the excess gaseous raw material withdrawn from the takeout means in a condensing means to form a condensed liquid raw material; and recycling the condensed liquid raw material back to the evaporation means thereby forming a closed loop circuit of flow for the raw material.

2. The method of claim 1, wherein said pressure adjusting means includes valve means located downstream of said gaseous raw material takeout means, said pressure adjusting means maintaining the pressure in the takeout means according to the amount of gaseous raw material passing out of said gaseous raw material takeout ports by varying with said valve means the amount of the gaseous raw material withdrawn from the takeout means and circulated through said closed loop circuit.

3. The method of claim 2, wherein the pressure of the gaseous raw material in the takeout means is further maintained by controlling the amount of evaporation of the liquid raw material in the evaporation means.

4. The method of claim 1, wherein the supply of the gaseous raw material is controlled by controlling the amount of gaseous raw material taken out through each takeout port.

5. The method of claim 1, wherein the supply of the gaseous raw material is controlled by controlling the amount of gaseous raw material supplied to each user location.

6. An apparatus for distributing gaseous raw material to a plurality of user locations, said apparatus comprising:

an evaporation means;

means for supplying liquid raw material to the evaporation means to form a gaseous raw material;

takeout means connected to the evaporation means for receiving the gaseous raw material from the evaporation means and having a plurality of takeout ports, each takeout port being connected to at least one user location;

control means for controlling the time and rate of flow of gaseous raw material passing out of each takeout port to a user location connected therewith independently of each other takeout port;

pressure adjusting means for maintaining the pressure of the gaseous raw material in the takeout means within predetermined limits and for withdrawing excess gaseous raw material therefrom;

condensing means connected to the takeout means for receiving excess gaseous raw material withdrawn from the takeout means and for condensing the withdrawn gaseous raw material to form condensed liquid raw material; and means for recycling the condensed liquid raw material back to the evaporation means in a closed loop circuit of flow for the raw material.

7. The apparatus of claim 6, including at least one of a pressure-reducing valve, a flow rate adjuster or a cutoff valve located downstream of each takeout port to control the time and rate of flow of gaseous raw material passing out of each takeout port to a user location.

8. The apparatus of claim 6, wherein the means for recycling the condensed liquid raw material back to the evaporation means includes a receiving tank in the closed loop circuit for receiving the condensed liquid raw material from the condensing means and a check valve between the tank and the evaporation means for preventing gaseous raw material in the evaporation means from passing into the receiving tank.

9. The apparatus of claim 6, including a demister between the evaporation means and the takeout means.

10. The apparatus of claim 6, wherein the pressure adjusting means includes valve means located downstream of the takeout means and before the condensing means for controlling the amount of gaseous raw material withdrawn from the takeout means.

11. The apparatus of claim 10, wherein the pressure adjusting means also controls the rate of evaporation of the liquid raw material in the evaporation means.

* * * * *